United States Patent
Thiel et al.

(10) Patent No.: US 8,138,779 B2
(45) Date of Patent: Mar. 20, 2012

(54) HANDLER FOR ELECTRONIC COMPONENTS, IN PARTICULAR IC'S, COMPRISING CIRCULATING UNITS, THE TEMPERATURE OF WHICH CAN BE CONTROLLED

(75) Inventors: Stefan Thiel, Rosenheim (DE); Franz Pichl, Übersee (DE); Günther Jeserer, Tuntenhausen (DE); Andreas Wiesböck, Stephanskirchen (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 17 days.

(21) Appl. No.: 12/525,894

(22) PCT Filed: Sep. 25, 2008

(86) PCT No.: PCT/EP2008/008154
§ 371 (c)(1),
(2), (4) Date: Aug. 5, 2009

(87) PCT Pub. No.: WO2009/046883
PCT Pub. Date: Apr. 16, 2009

(65) Prior Publication Data
US 2010/0315113 A1    Dec. 16, 2010

(30) Foreign Application Priority Data
Oct. 5, 2007 (DE) .......................... 10 2007 047 680

(51) Int. Cl.
*G01R 31/20* (2006.01)
*G01R 31/26* (2006.01)
*G01R 31/00* (2006.01)

(52) U.S. Cl. .......... 324/757.01; 324/762.01; 324/750.13
(58) Field of Classification Search .. 324/750.01–750.3, 324/762.01–762.09, 757.01–757.05; 414/935–941
See application file for complete search history.

(56) References Cited

U.S. PATENT DOCUMENTS

| | | | |
|---|---|---|---|
| 3,761,808 A | 9/1973 | Ryan | |
| 5,125,503 A | 6/1992 | Ueberreiter et al. | |
| 5,184,068 A | 2/1993 | Twigg et al. | |
| 6,148,145 A | 11/2000 | Kadotani | |
| 6,313,651 B1 * | 11/2001 | Hembree et al. | 324/756.02 |
| 6,407,567 B1 * | 6/2002 | Etter | 324/750.05 |
| 6,919,734 B2 * | 7/2005 | Saito et al. | 324/750.09 |
| 2007/0080703 A1 | 4/2007 | Ding | |

FOREIGN PATENT DOCUMENTS

| | | |
|---|---|---|
| DE | 39 12 589 | 11/2000 |
| DE | 100 03 839 | 8/2001 |

OTHER PUBLICATIONS

International Search Report for PCT/EP2008/008154, mailed Apr. 6, 2009.

* cited by examiner

*Primary Examiner* — Huy Q Phan
*Assistant Examiner* — Tung X Nguyen
(74) *Attorney, Agent, or Firm* — Nixon & Vanderhye PC

(57) ABSTRACT

A handler for electronic components, in particular IC's, for controlling the temperature of the components and supplying and removing said components to and from a test device has circulating units that can be moved along a circulating track. Each unit has at least one retaining unit for retaining a component. In addition, the circulating units have temperature-control chambers containing components that are retained by the retaining units, so that the temperature of the components can be controlled during transport from the charging station to the test station.

19 Claims, 11 Drawing Sheets

HANDLER FOR ELECTRONIC COMPONENTS, IN PARTICULAR IC'S, COMPRISING CIRCULATING UNITS, THE TEMPERATURE OF WHICH CAN BE CONTROLLED

This application is the U.S. national phase of International Application No. PCT/EP2008/008154 filed 25 Sep. 2008, which designated the U.S. and claims priority to Germany Application No. 10 2007 047 680.0 filed 5 Oct. 2007, the entire contents of each of which are hereby incorporated by reference.

The invention relates to a handler for electronic components, in particular ICs, comprising a plurality of circulating units which can be moved on a circulating path and each have at least one retaining unit for retaining a component and can be moved between a loading station for loading the retaining unit with the components, a test station for supplying the components to a contacting means connected to a test device and an unloading station for removing the components from the retaining units, as claimed in the pre-characterizing clause of Claim 1.

The operativeness of electronic components, such as for example ICs, is conventionally tested before they are for example mounted on printed circuit boards or otherwise used. The components to be tested are in this case brought into contact by a handling robot, conventionally referred to as a handler, with contacting means which are embodied in particular as contact bases and are in electrical contact with a test head of a test device. After completion of the testing process, the components are removed again from the contacting means by means of the handler and sorted as a function of the test result.

Handlers conventionally operate in such a way that the components, which are supplied via a loading station, are first grasped by retaining units (plungers) which are embodied as vacuum suction cups, whereupon the components are then transferred into a different position by means of the retaining units and aligned in such a way that they are advanced onward toward the test head on a rectilinear path in order to enter into contact with the contacts of the test head.

In order to carry out the tests under specific temperature conditions, it is furthermore known to adjust the temperature of the components to specific temperatures prior to the testing process. These temperatures can for example be in a range of between −60 and +200° C.

The temperature of the components is controlled conventionally in a convective and/or conductive manner in a stationary, accordingly heat-insulated housing. In the case of convective temperature control, correspondingly temperature controlled air or another gas flows around the components in the housing until the components have reached the desired temperature. In the case of conductive temperature control, the components are positioned on a heating or cooling plate from which heat is then transferred to the components.

In order to be able to carry out the process of testing the components in as economical a manner as possible, it is crucial for the handlers to operate at very high speeds, i.e. for throughputs which are as high as possible to be attained. It is therefore very important for both the times for transporting the components within the handler and the duration required for controlling the temperature of the components to be shortened as far as possible.

US 2007/0080703 A1 discloses a handler as claimed in the pre-characterizing clause of Claim 1, which serves to visually survey the contacts of semiconductor components. A device of this type uses an eight-arm, rigid turnstile. The components to be inspected are retained there at the free outer ends of the radially outwardly extending turnstile arms with gradual rotation of the turnstile on a circular circulating path. However, this document does not refer to control of the temperature of the components.

The invention is based on the object of providing a handler for electronic components, in particular ICs, that is suitable for particularly precise control of the temperature of the components and is designed for the highest throughputs.

According to the invention, this object is achieved by a handler having the features of Claim 1. Advantageous embodiments of the invention are described in the further claims.

According to the invention, the circulating units each have at least one temperature control chamber containing the components mounted to the retaining units, so that the temperature of the components can be controlled during transportation from the loading station to the test station.

The handler according to the invention allows the temperature of the components to be controlled in a very precise manner, as the temperature is controlled immediately before the components are contacted with the test head and there are no non-temperature controlled paths of transportation between the loading station and the test station. Furthermore, the throughput of the components through the handler can be greatly increased during testing of the components under specific temperature conditions. The temperature of the components to be tested can be controlled immediately, once they have been taken over by the retaining units (in particular by vacuum suction cups) of the handler in the loading station, during their further path of transportation through the handler up to the test device, so that this entire transportation path is optimally utilized for the temperature control. Depending on temperature requirements, it may in this case be sufficient for the temperature of the components to be controlled exclusively in the region of the circulating temperature control chambers. It is however readily possible and may also be highly expedient for the temperature of the components to be controlled in advance in an additional temperature control chamber preceding the loading station.

According to an advantageous embodiment, the temperature control chambers are embodied in a trough-shaped manner and each have a housing with a base plate, a front wall, a rear wall and side walls, while the housing is opened radially outwardly and is covered at least in a region between the loading station and the test station by a stationary cover arranged concentrically with the circular path. A cover of this type prevents in a simple manner uncontrolled flowing-away of temperature controlled fluid radially outward. The temperature at the components may thus be adjusted and maintained very uniformly with low temperature complexity. It is readily possible for the cover to extend around the entire circulating path of the circulating units and to have merely in the region of the loading station, test station and unloading station appropriate openings in order to be able to introduce the components through these openings into the temperature chambers and to remove them therefrom.

According to an advantageous embodiment, the retaining units are fastened to the base plate of the circulating units and temperature control chambers for retaining the components and comprise press rams which are displaceable relative to the base plate and at the leading end of which a component is retained by means of reduced pressure. This allows the circulating units, i.e. the temperature control chambers to be exchanged in a simple manner together with the retaining units, if it is desirable to adapt the configuration or arrangement of the retaining units, for example owing to altered contact bases on sides of the test head.

According to an advantageous embodiment, there are arranged within the temperature control chambers in each case a plurality of retaining units which are separated from one another by heat insulating material, so that each retaining unit or a subgroup of retaining units is arranged in an individual chamber surrounded laterally by heat insulating material. This allows heat losses and also an exchange of heat between the individual retaining units to be prevented in a particularly effective manner.

According to an advantageous embodiment, the circulating units having temperature control chambers can be moved independently of one another on the circular path. This allows a circulating unit to be withdrawn from the region of the loading opening and temperature controlled immediately, once the loading with components is completed, irrespective of whether the preceding circulating unit has already been removed from the test station. This greatly increases the operating speed, i.e. the throughput of the handler.

It is particularly advantageous if the circulating units consist of circulating carriages which are guided on a stationary, circular guide means.

According to an advantageous embodiment, one of the drive shafts is connected to a vacuum/fluid transfer means which is arranged flush therewith and which can be used to transfer vacuum and/or fluid from a stationary vacuum/fluid supply source to the retaining means. In this way, it is possible to pass fluid, for example purified ambient air, to the circulating units and to bring it there, i.e. in proximity to the components, to the desired temperature using a temperature control means in order to control the temperature of the components using a fluid, the temperature of which is controlled in this way. In this case, the temperature of the fluid is thus controlled in direct proximity to the components, so that the remaining path of passage to the component is very short and the temperature can be readjusted very rapidly if this is required.

It is in this case particularly advantageous if the vacuum/fluid transfer means has a housing, which is rotatably engaged with the drive shaft, and a central part which is arranged within the housing, can be fastened stationarily to the handler and creates, via axial bores and radial bores associated therewith, a vacuum or fluid connection to radial conduits of the housing which can rotate together with the drive shaft.

The invention will be described hereinafter in greater detail and by way of example with reference to the drawings, in which.

Figure 1:
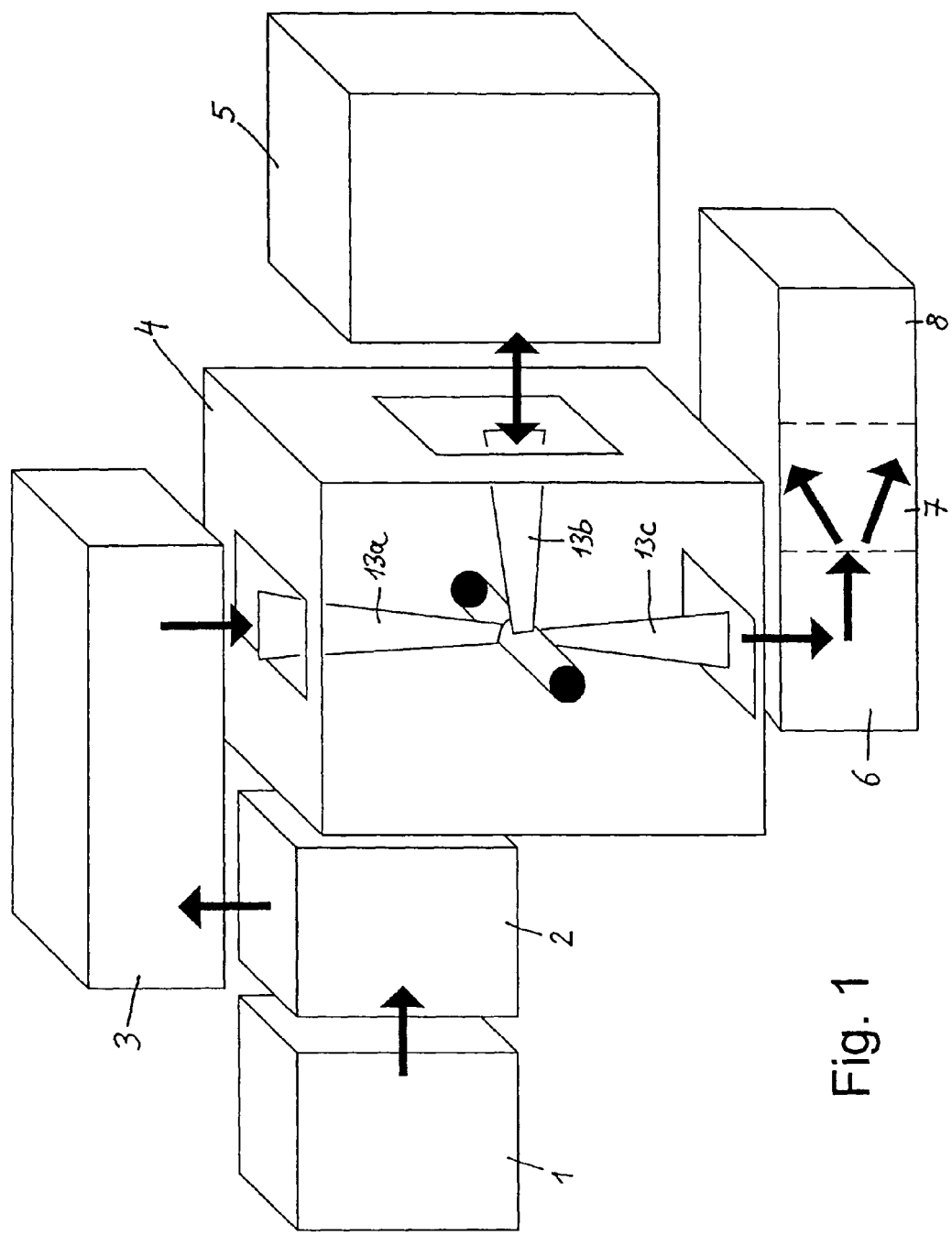
FIG. 1 is a schematic view of the handler according to the invention and surrounding devices and modules used in the testing of electronic components.

A system for testing electronic components in the form of ICs (semiconductor components with integrated circuits) will first be described schematically and by way of example with reference to FIG. 1. The arrows indicate in this case the route of the components.

The components are first supplied to a loading unit 1. The loading unit 1 transports the components first to an upstream temperature control chamber 2 to adjust the temperature of the components within the temperature control chamber 2 to a predetermined temperature. This may be for example between −60 and +200° C. This temperature precontrol can in this case be carried out in a convective and/or conductive manner. Once the components to be tested have been brought in the temperature control chamber 2 to the desired temperature, they are removed from the temperature control chamber 2 by a transport unit 3, which may for example be a pick and place unit, and supplied to a handler 4 (handler central unit). The handler 4 contains the necessary means for receiving, retaining and controlling the temperature of the components, and a component movement means to supply the components to a test head 5 and, after completion of the testing process, to remove them again from the test head 5. Furthermore, the handler 4 can contain specific means in order to act on the components to be tested in a specific manner, for example with acceleration, pressurization or inclination of the components. The test head 5 is docked onto the handler 4 in a known manner. The test head 5 is part of an electronic test device which is used to test the components and to evaluate the test results.

After completion of the test, the components of the handler 4 are again removed from the test head 5 and supplied to a sorting unit 7 by means of a removal unit 6 (unloader or pick and place unit). In the sorting unit 7, the components are sorted as a function of the test result. Subsequently, the components reach an unloading station 8.

The temperature control chamber 2, arranged outside the handler 4, is merely optional. Furthermore, the components do not have to be supplied to the handler 4 via the transport unit 3 in the form of a pick and place unit, but can also be supplied, as a person skilled in the art is aware, via gravity. This is referred to as a gravity handler.

The construction and mode of operation of the handler 4 according to the invention will be described hereinafter in greater detail with reference to FIGS. 2 to 16.

The handler 4 has a guide means 9 with two circular, stationary guides 9a, 9b to which a plurality of circulating carriages 10 are displaceably mounted. In the exemplary embodiment shown, the two guides 9a, 9b each consist of circular rings which have the same diameter, are arranged in mutually parallel, set-apart vertical planes and extend around a common center axis 11. The mutual distance between the guides 9a, 9b corresponds roughly to the width of the circulating carriages 10 which thus do not protrude, or protrude only slightly, laterally beyond the two guides 9a, 9b. Furthermore, each guide 9a, 9b consists of peripheral web segments protruding in the horizontal direction from a support structure (not shown in greater detail) retaining the guides 9a, 9b in the direction of the respectively opposing guide. The guides 9a, 9b can for example be arranged in direct proximity to two opposing side walls of a housing of the handler 4.

Figure 2:
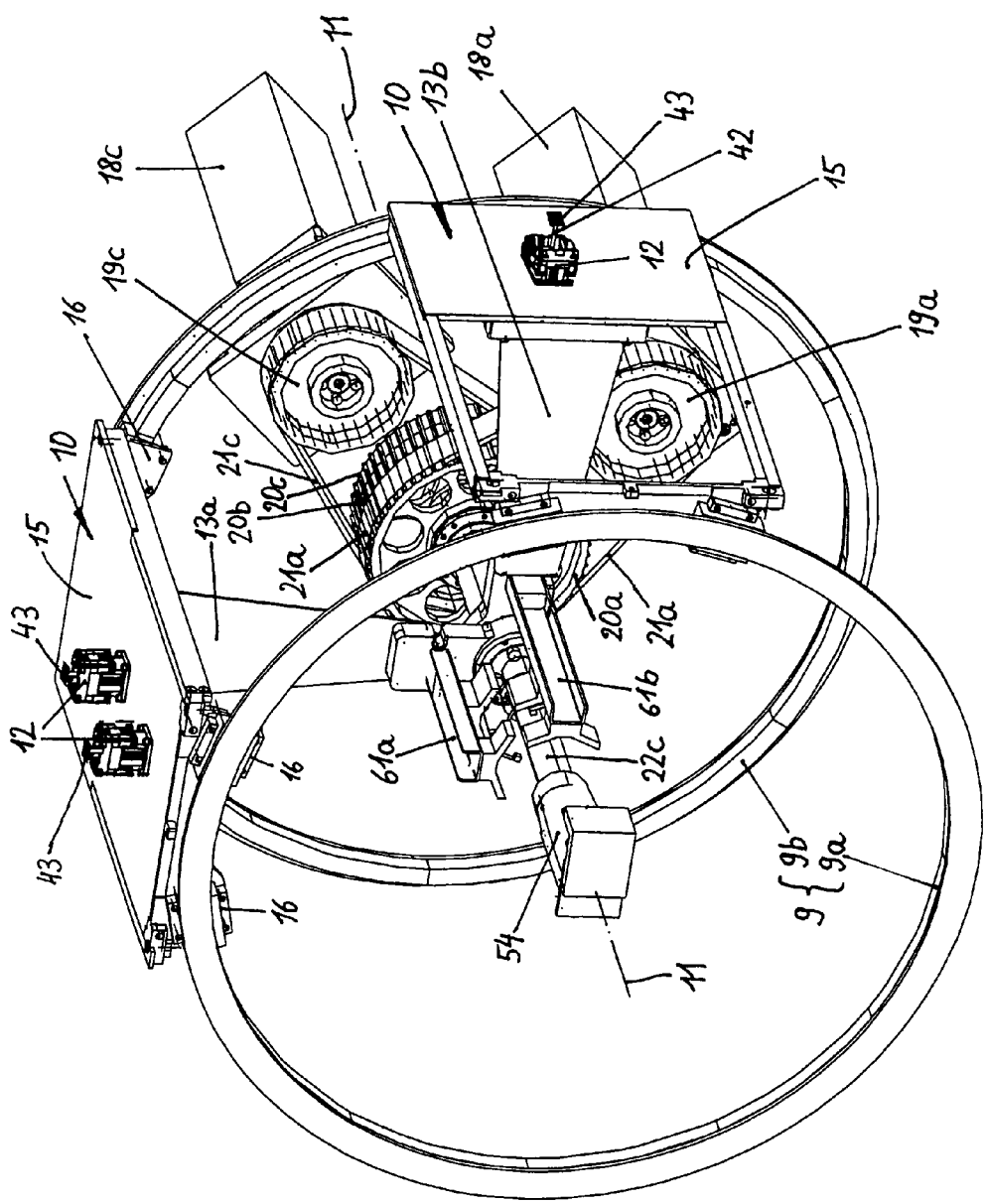
FIG. 2 is a perspective view of the guides and also of parts of the circulating carriages and drive means of the handler according to the invention, just two circulating carriages being shown and a plurality of components not being shown for the sake of clarity.
Figure 3:
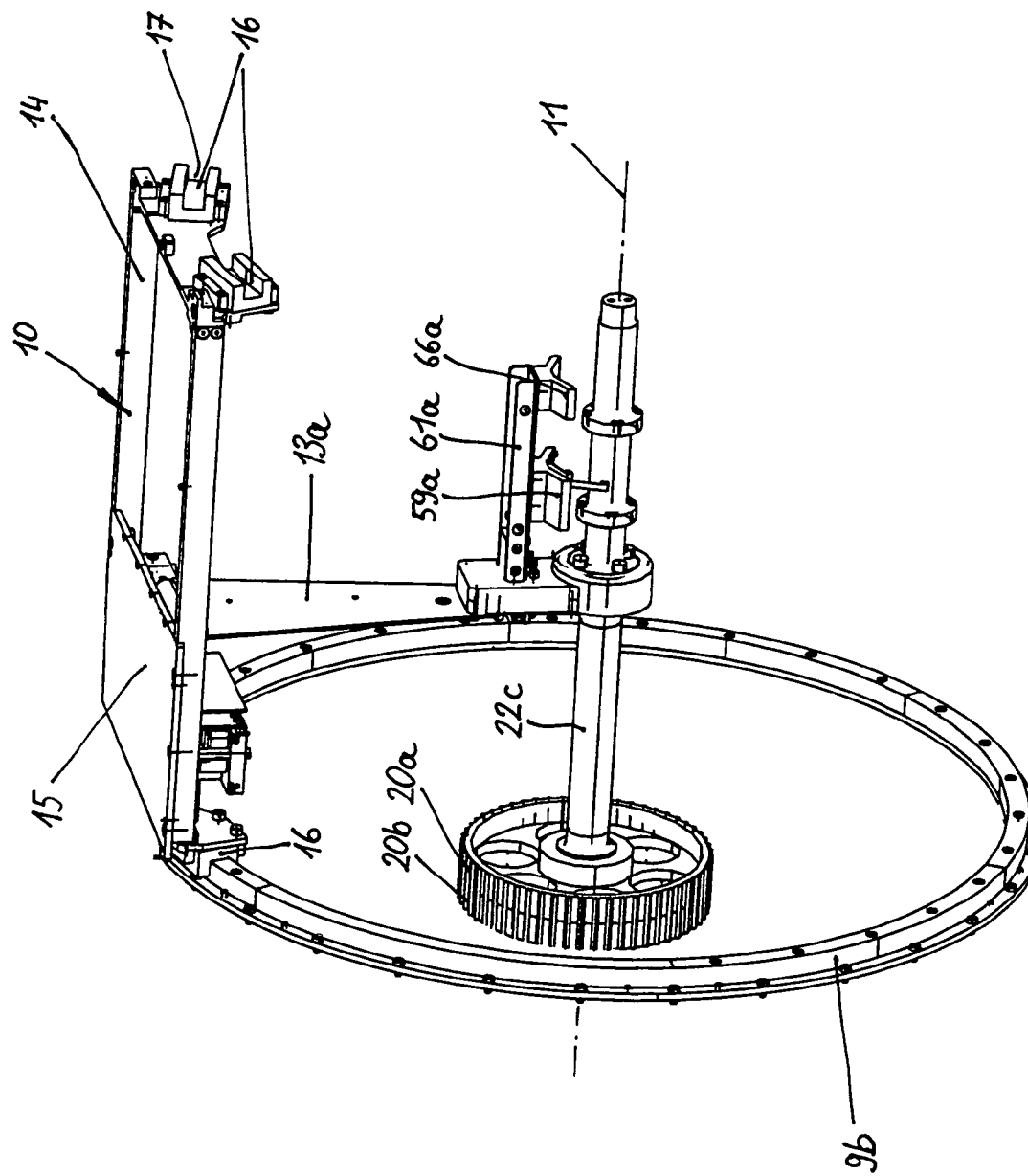
FIG. 3 shows an individual guide with a partially shown circulating carriage from a different perspective.

The circulating carriages 10 can be guided independently of one another along the guides 9a, 9b on a circular path around the horizontal center axis 11, i.e. the mutual distances between the circulating carriages 10 can be varied in the direction of circulation. In the exemplary embodiment described with reference to the figures, three substantially identical circulating carriages 10 are provided. FIGS. 2 and 3 show just two circulating carriages and one circulating carriage 10 respectively, merely for the sake of clarity. Depending on the intended use of the handler, the number of circulating carriages 10 can however differ significantly therefrom. For example, it is possible to provide two to eight, in particular three to five circulating carriages 10.

Figure 6:
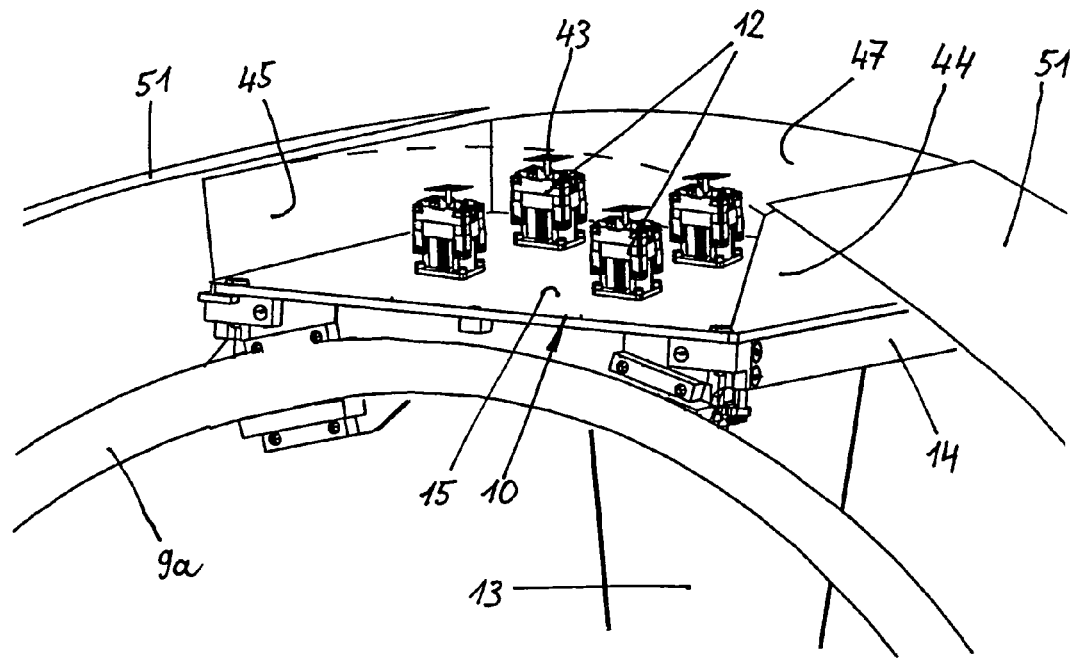
FIG. 6 is a partly cut-free view of the circulating carriage with a temperature control chamber from FIG. 5, four retaining units (plungers) for the components being shown.
Figure 7:
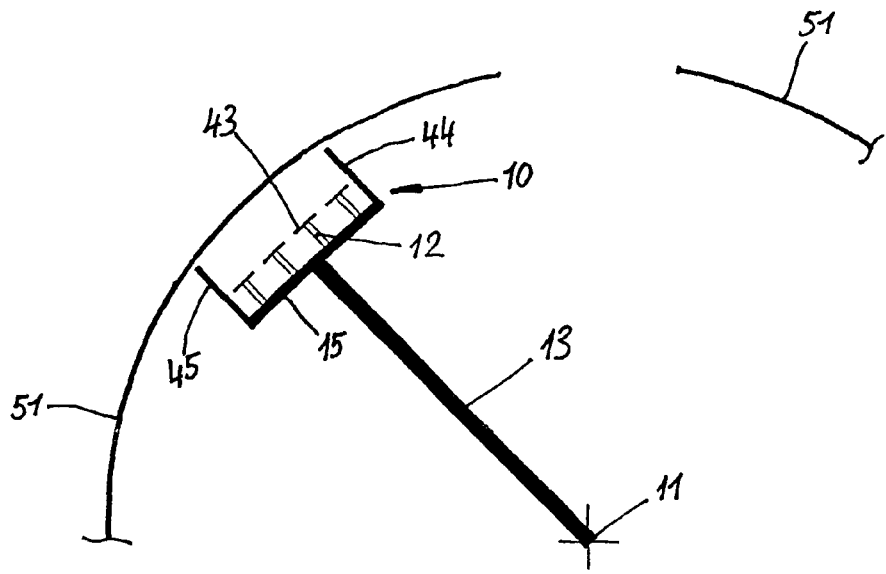
FIG. 7 is a schematic side view of a circulating carriage with a drive arm to illustrate the interaction with an outer cover.
Figure 8:
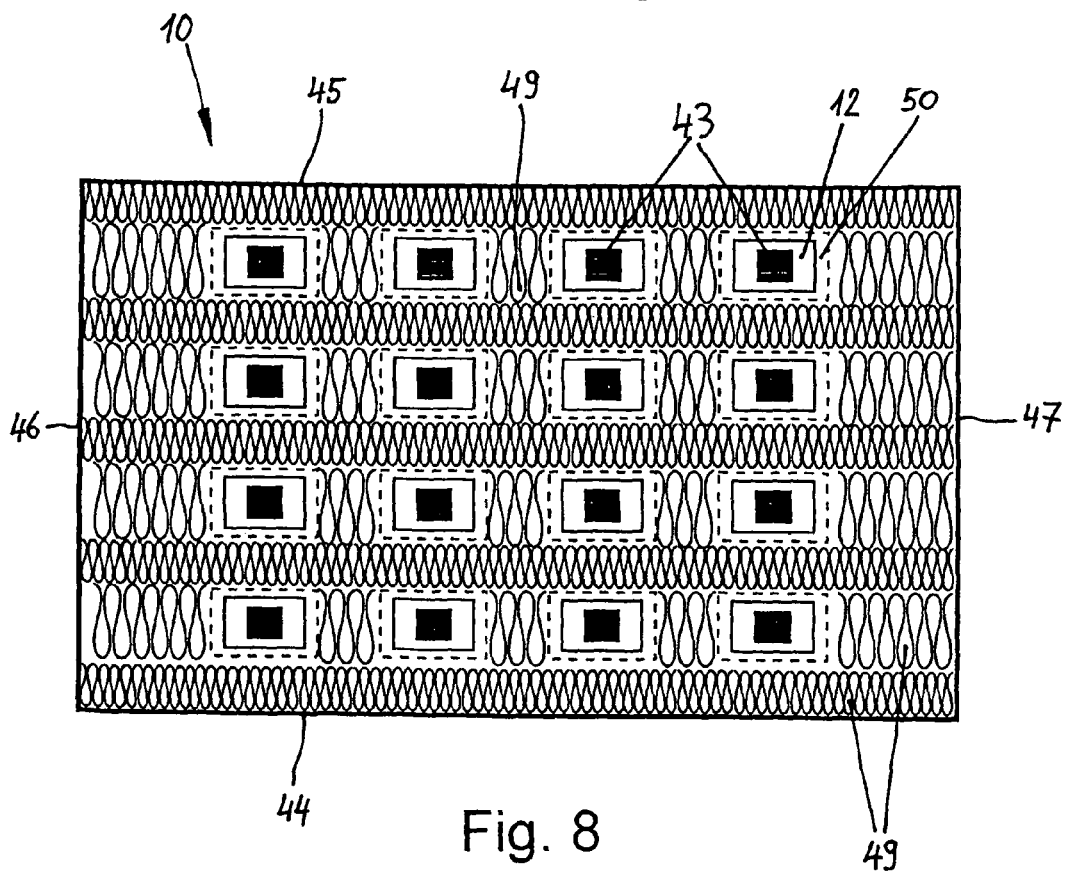
FIG. 8 is a schematic plan view onto a circulating carriage with 16 retaining units.

In the illustrated exemplary embodiment, there are fastened, as shown in FIGS. 7 and 8, to each circulating carriage 10 sixteen identical retaining units 12 in the form of vacuum suction cups which each serve to retain an electronic component 43 to be tested, for example a semiconductor component (IC). FIGS. 2 to 6 show fewer retaining units 12, or no retaining units whatsoever, merely for the sake of clarity and in order to show components arranged thereafter. It is however readily possible to provide on each of the circulating carriages 10 a different number of retaining units 12 in order to be able simultaneously to receive a corresponding number of components 43, to transport them to the test head 5 and to remove them again therefrom, allowing particularly high throughputs to be attained. It may be particularly expedient to arrange the retaining units 12 on the circulating carriage 10 in the form of a matrix, for example in the form of a 3×3, 2×4, 4×4 or 5×5 matrix.

It is particularly expedient if the retaining units 12 can be activated independently of one another, i.e. individually. It is then possible not to fit individual retaining units 12 of a circulating carriage 10 with a component 43 and to use only a subgroup of retaining units 12 or else only a single retaining unit 12 for the test.

Figures 9, 10:
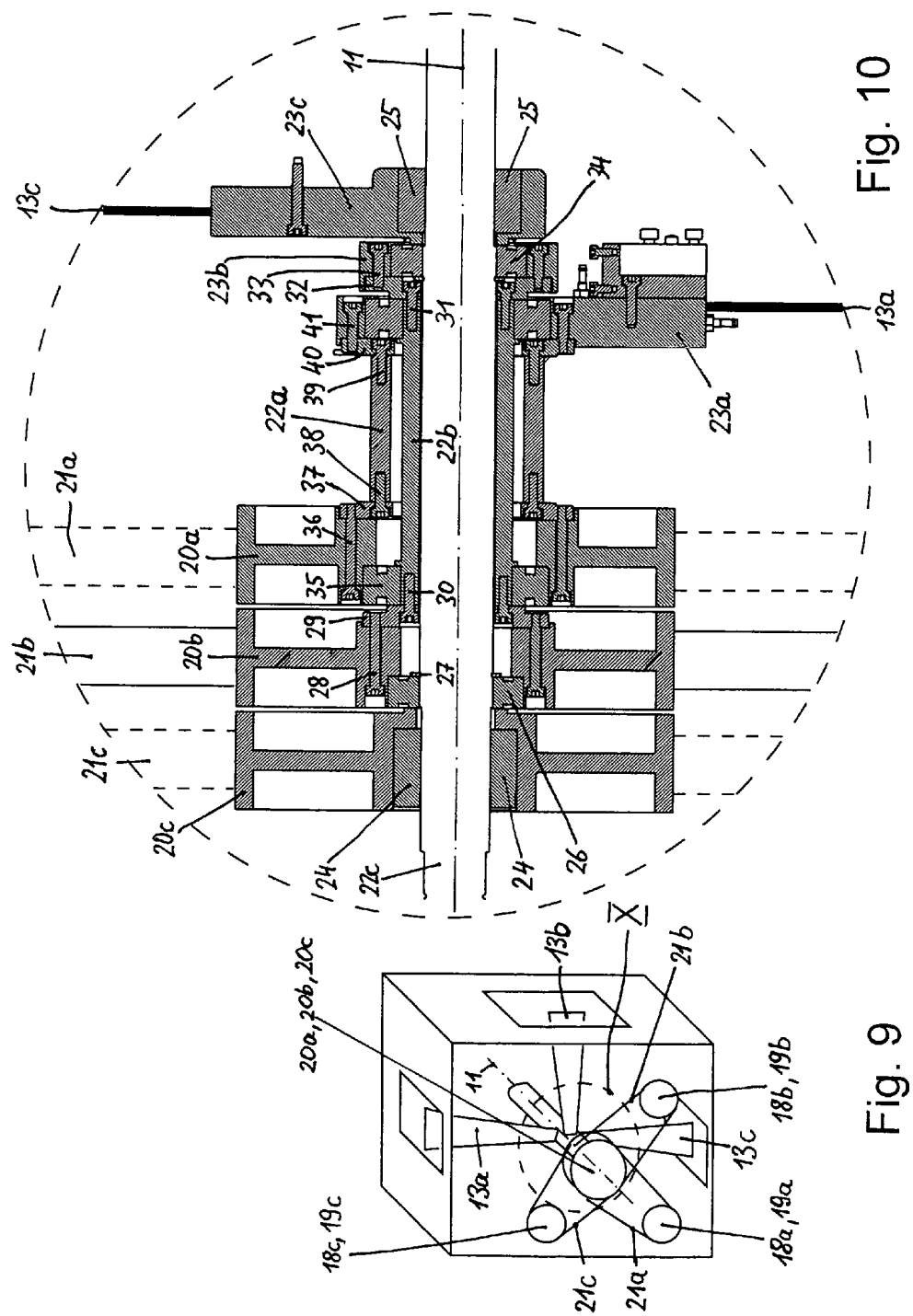
FIG. 9 is a schematic view of the handler.
FIG. 10 is a longitudinal section through the drive shafts in the region of FIG. 9.

The schematic drawings of FIGS. 1 and 9 show not the circulating carriages 10 per se, but merely associated drive arms 13 (the individual drive arms are denoted by 13a, 13b, 13c) which extend from the center axis 11 radially outward to a respective circulating carriage 10 and drive said circulating carriage in the direction of circulation. The circulating carriages 10 can approach independently of one another, as will be described hereinafter with reference to FIG. 16, individual positions along the circulating path, thus allowing downtimes, i.e. times in which no components are contacted with the test head 8, to be minimized and the throughput through the handler 4 to be increased.

The circulating carriages 10 have a rectangular frame 14 to which a base plate 15, which is divided in two, is securely screwed. FIG. 2 shows the lateral circulating carriage 10 only with one half of the base plate 15 in order to allow the parts positioned thereafter to be viewed. FIGS. 3 and 6 also show only one of the two halves of the plate. The base plate 15 serves in particular to fasten the retaining units 12 and is the bottom part of a temperature control chamber in which the temperature of the components 43 can be controlled.

As may be seen from FIGS. 2 and 3, two respective guide jaws 16, which overlap the guides 9a, 9b, are fastened to the two opposing sides of the frame 14. The guide jaws 16 have a U-shaped cross section, their open side pointing laterally outward. The guide grooves 17 in the guide jaws 16 (FIG. 3) are adapted to the profile of the guides 9a, 9b in such a way that the circulating carriages 10 are guided on the guides 9a, 9b almost without play.

The releasable fastening of the base plate 15 to the frame 14 offers the advantage that the base plate 15 can be exchanged, together with the retaining units 12, in a simple manner, if for example adaptation to a different surrounding structure is required.

Figure 5:
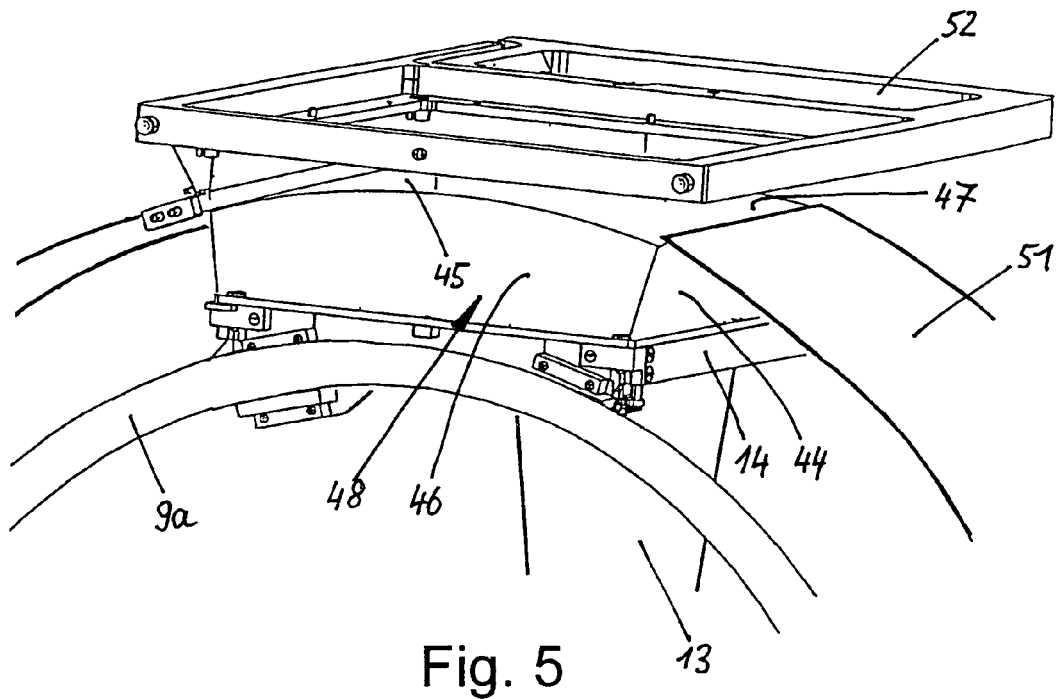
FIG. 5 is a perspective, partly schematic view of a circulating carriage with a housing, embodied as a temperature control chamber, in the region of the loading opening.

As may be seen from FIGS. 5 to 7, each circulating carriage 15 has a temperature control chamber with a housing 48 consisting of the base plate 15, a front wall 44, a rear wall 45 and also two side walls 46, 47. The walls 44-47 form, together with the flat base plate 15, a trough-like structure which is laterally and radially inwardly at least substantially closed, but radially outwardly, i.e. upwardly in FIGS. 5 and 6, opened. That part of the retaining units 12 that is shown by way of example in FIG. 6 is located completely within the housing 48.

The temperature of the components 43 is controlled expediently via a fluid which is passed along the drive arms 43 to the individual retaining units 12 and thus purposefully to the individual components 43. The gap between the individual retaining units 12 is, as is illustrated schematically in FIG. 8, filled out by means of heat insulating material 49, thus forming around the individual retaining units 12 small individual chambers 50, the side walls of which are at only a short distance from the retaining units 12. Alternatively, it is however also possible to insulate merely the walls 44-47 accordingly.

In order to prevent, during control of the temperature of the components 43, heat from flowing away in an uncontrolled manner radially outwardly from the temperature control chambers, a peripheral cover 51, in the form of a stationary, annular metal cover sheet, is arranged at a short radial distance outside the circulating carriages 10. The cover 51 covers the circulating carriages 10 over their entire circulating path apart from those regions in which the circulating carriages 10 are loaded with components 43, unloaded and slid radially outward in the direction toward the test device. FIGS. 5 and 6 show the loading station in which the metal cover sheets are set apart from one another in the direction of circulation sufficiently far to allow the components 43 to be attached to the associated retaining units 12 unimpeded.

In addition, FIG. 5 shows a further stationary frame 52 arranged above the loading opening. However, within the scope of the present invention, this frame does not have any decisive significance.

Each circulating carriage 10 can be made to circulate by its own drive arm 13 along the guides 9a, 9b. The drive arms 13 are stable sheet metal parts which are embodied in a very rigid manner in the drive direction or direction of circulation. In the lateral direction, on the other hand, the drive arms 13 do not have to display any particular stability, as they do not have to assume any carrying function or lateral guidance function for the circulating carriages 10. The metal sheet may therefore be correspondingly thin, so that the drive arms 13 can have a low mass. In addition, drive arms 13 of this type provide lateral tolerance compensation. The drive arms 13 are arranged in the region between the two guides 9a, 9b and extend from the radially inner side of the circulating carriages 19 in the direction toward the center axis 11.

Figure 4:
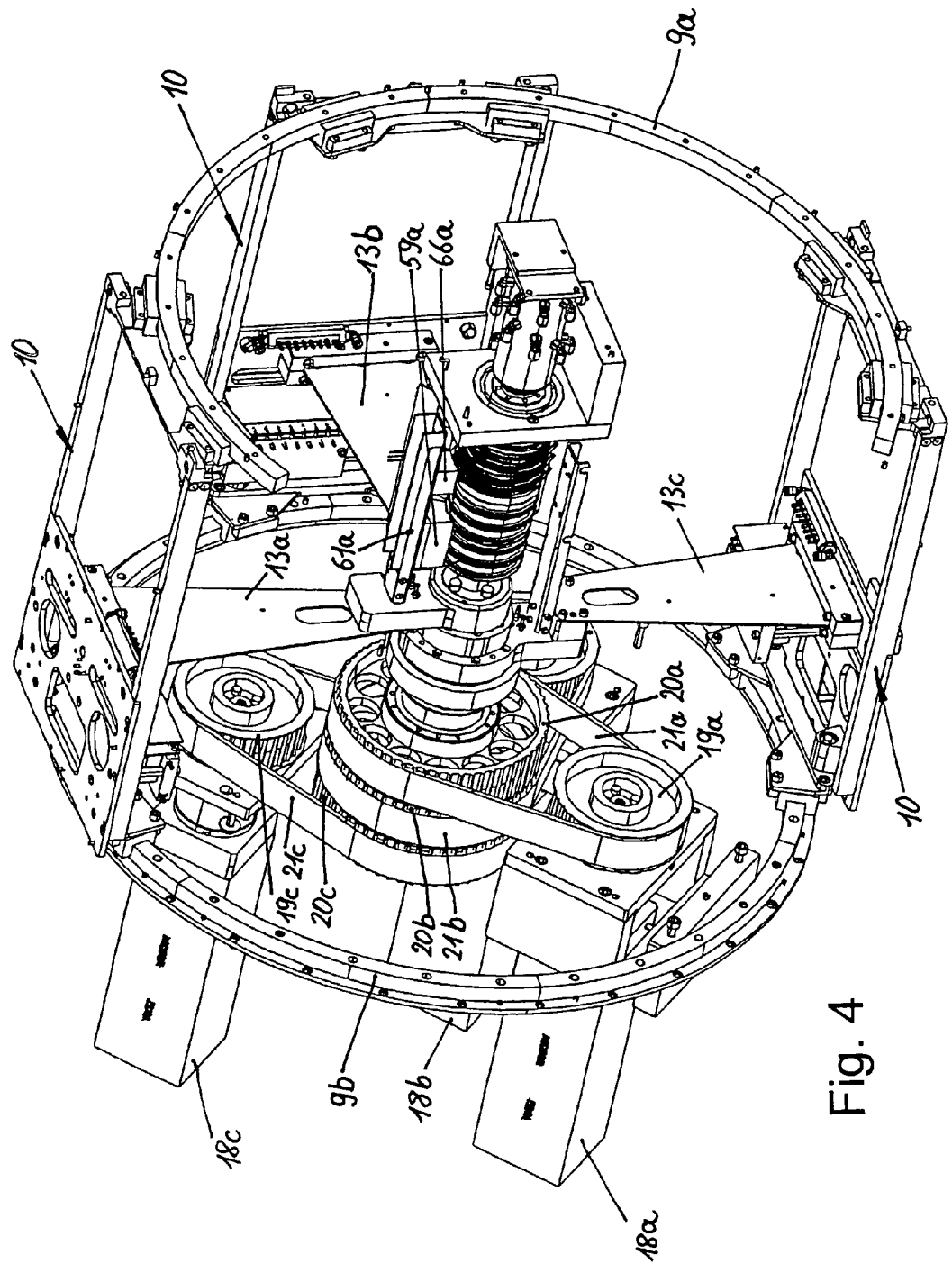
FIG. 4 is a perspective view of the guides and also of parts of the circulating carriages and drive means with additional details compared to FIG. 2.

As may be seen in particular from FIGS. 2, 4 and 10, each drive arm 13a, 13b, 13c is driven by its own drive means in order to be able to move the circulating carriages 10 independently of one another.

The means for driving the drive arm 13a comprises substantially a drive motor 18a, a drive gear wheel 19a driven thereby, a central gear wheel 20a which is rotatably engaged with the drive gear wheel 19a via a toothed belt 21, and a drive shaft 22a which is rotationally engaged on the one hand with the central gear wheel 20a and on the other hand with a coupling part 23a of the drive arm 13a.

The means for driving the drive arms 13b comprises a drive motor 18b, a drive gear wheel 19b which can be made to rotate thereby, a central gear wheel 20b which is rotationally engaged with the drive gear wheel 19b via a toothed belt 21b, and also a drive shaft 22b which is rotationally engaged on the one hand with the central gear wheel 20b and on the other hand with a coupling part 23b of the drive arm 13b.

The means for driving the drive arm 13c comprises a drive motor 18c, a drive gear wheel 19c which can be made to rotate thereby, a central gear wheel 20c which is rotationally engaged with the drive gear wheel 19c via a toothed belt 21c, and also a drive shaft 22c which is rotationally engaged on the one hand with the central gear wheel 20c and on the other hand with a coupling part 23c of the drive arm 13c.

Figure 11:
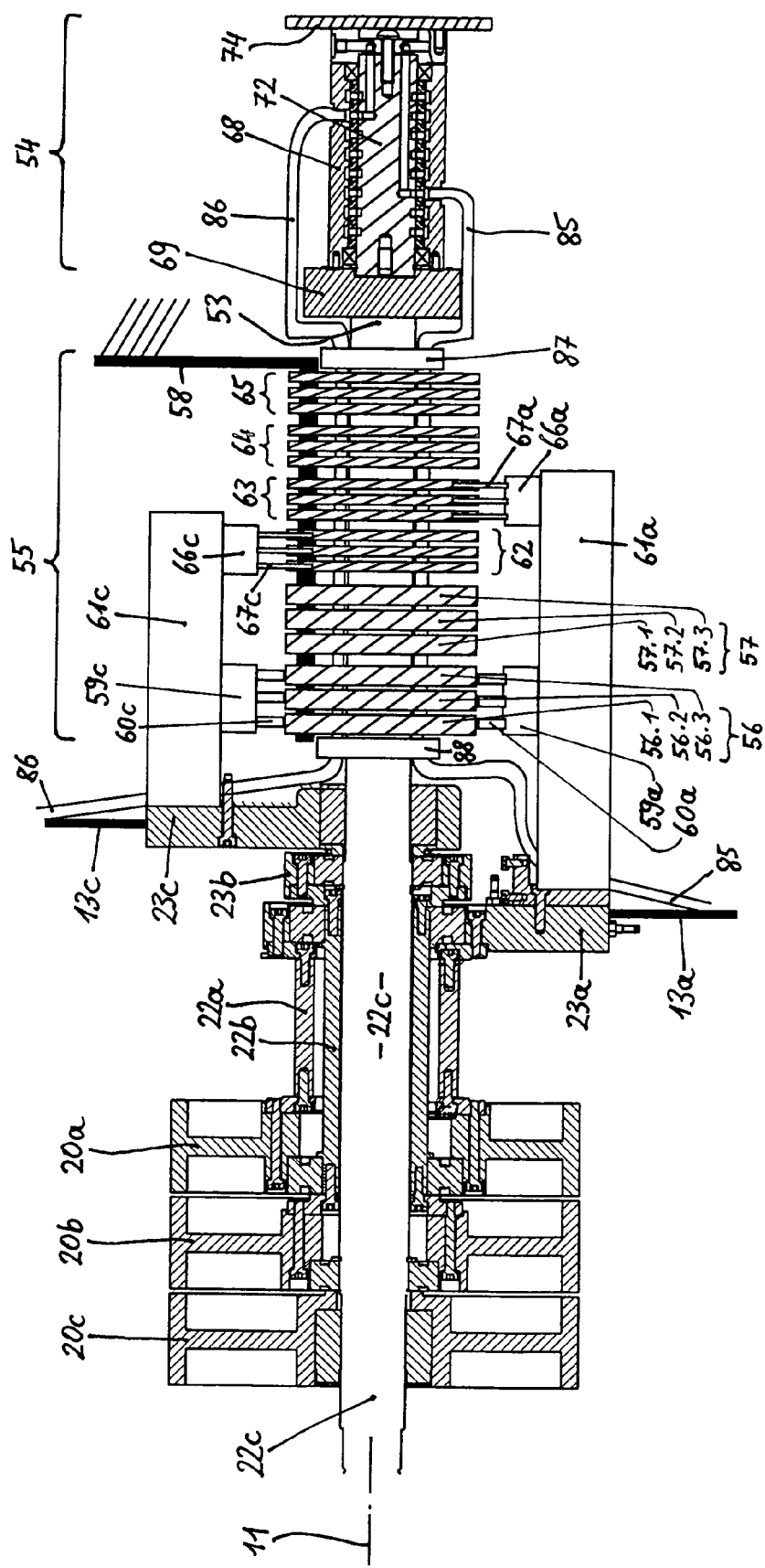
FIG. 11 is a longitudinal section through the drive shafts, the electrical power/data transmission means and the vacuum/fluid supply means.

The three drive shafts 22a, 22b, 22c are arranged, as may be seen from FIGS. 10 and 11, one inside another and are rotatable about the common horizontal center axis 11. The drive shaft 22c is the innermost drive shaft and is mounted in its left end region, as shown in FIG. 11, to the frame of the handler 4 in a manner not illustrated in greater detail. Fastened to the right end 53 of the innermost drive shaft 22c is a bearing ring 69 which rotatably supports the drive shaft 22c on a stationary support structure of the handler. A substantially cylindrical vacuum/fluid transfer means 54, which is arranged flush with the drive shaft 22c and will be described hereinafter in greater detail, is flanged onto the bearing ring 69.

The rotational engagement between the central gear wheel 20c and the innermost drive shaft 22c can, as shown in FIG. 10, be brought about by means of a tongue-and-groove connection, spring elements 24 meshing with corresponding grooves provided on the one hand in the central gear wheel 20c and on the other hand in the drive shaft 22c. Alternatively, other connections are also conceivable, in particular clamping means between the drive shaft 22c and gear wheel 20c.

Similarly, the rotational engagement between the coupling part 23c of the drive arm 13c and the innermost drive shaft 22a can be carried out by means of a tongue-and-groove connection, spring elements 25 meshing with corresponding grooves provided on the one hand on the coupling part 23c and on the other hand on the drive shaft 22c.

The central gear wheel 20b is rotatably mounted on the innermost drive shaft 22c and arranged in direct proximity to the central gear wheel 20c. The central gear wheel 20b is mounted, in the exemplary embodiment shown, by means of ball bearings 26. The inner bearing shell of the ball bearing 26 is in this case axially secured on the one hand by abutment against the central gear wheel 20c and on the other hand by means of a stop ring 27 resting in a radially encircling groove in the innermost drive shaft 22c.

The central gear wheel 20b is rotationally engaged with a flange part 29 via screws 28, and the flange part is rotationally engaged with the drive shaft 22b by means of screws 30. This central drive shaft 22b is embodied in a tubular manner and surrounds the innermost drive shaft 22a with a degree of play, so that the central drive shaft 22b is rotatable relative to the innermost drive shaft 22c.

At the opposite end, the central drive shaft 22b is rotationally engaged with a flange part 32, again by means of screws 31, and the flange part is rotationally engaged with the coupling part 23b by means of screws 33. The coupling part 23b is rotatably mounted on the innermost drive shaft 22c, again by means of a ball bearing 34.

The central gear wheel 20a is arranged, again, in direct proximity laterally next to the central gear wheel 20b and rotatably mounted on the central drive shaft 22b by means of a ball bearing 35. The central gear wheel 20a is rotationally engaged with a flange part 37 by means of screws 36, and the flange part is rotationally engaged with the drive shaft 22a by means of screws 38. The tubularly embodied drive shaft 22a surrounds the central drive shaft 22b with radial play and is rotatable relative thereto. At the opposite end, the drive shaft 22a is rotationally engaged with a flange part 40 by means of screws 39, and the flange part is rotationally engaged with the coupling part 23a of the drive arm 13a by means of screws 41.

FIGS. 10 and 11 show that on the one hand the central gear wheels 20a, 20b, 20c and on the other hand the drive arms 13a, 13b, 13c are arranged in direct proximity next to one another, thus providing a very compact drive unit allowing mutually independent movement of the individual drive arms 13a, 13b, 13c and thus of the circulating carriages 10.

It will be readily apparent to a person skilled in the art that not only three drive shafts, but without high additional design costs also four or more drive shafts can be arranged one inside another in the described manner, if four or more circulating carriages 10 are to be driven independently of one another using their own drive means.

As may be seen from FIG. 11, there is arranged in the region of the innermost drive shaft 22c, between the drive arms 13 and the vacuum/fluid transfer means 54, an electrical power/data transmission means 55 via which on the one hand the circulating carriages 10 are supplied with power and on the other hand data can be exchanged between means, arranged in the region of the circulating carriages 10, and data processing equipment. Electrical power is required at different points of the circulating carriages 10, for example for controlling the temperature of or heating heating coils on the retaining means 12 (vacuum suction cups), for controlling vacuum valves provided on the individual heating units 12 (if for example one or more heating units 12 are not to be used), for supplying power to CAN (controller area network) boards attached to the circulating carriage 10, and for controlling valves for heating and for supplying pressure to the individual vacuum suction cups.

The exchange of data via the data transmission means serves different purposes, in particular the transmission of data from temperature and vacuum sensors to the vacuum suction cups and also for the purposes of communication of the CAN boards with the data processing means.

The electrical power transmission means has, in the exemplary embodiment shown in FIG. 11, two slip ring groups 56, 57 each having three slip rings 56.1, 56.2, 56.3 and 57.1, 57.2, 57.3 respectively. In the present case, two slip ring groups are provided in order (optionally) to be able to operate at two different voltages, for example at 24 and 48 volts. In FIG. 11 only the left slip ring group 56 is used. Only the slip ring group 56 will therefore be described hereinafter.

The slip ring group 56 has three slip rings 56.1, 56.2, 56.3, as a three-core power line is used. Each slip ring is associated with a specific core. The individual slip rings are arranged stationarily next to one another within the handler along the inner drive shaft 22c around the common center axis 11 and connected to the individual cores of a CAN bus 58. The slip rings are penetrated centrally by the drive shaft 22c, wherein the drive shaft 22c can rotate relative to the stationary slip rings.

Figure 14:
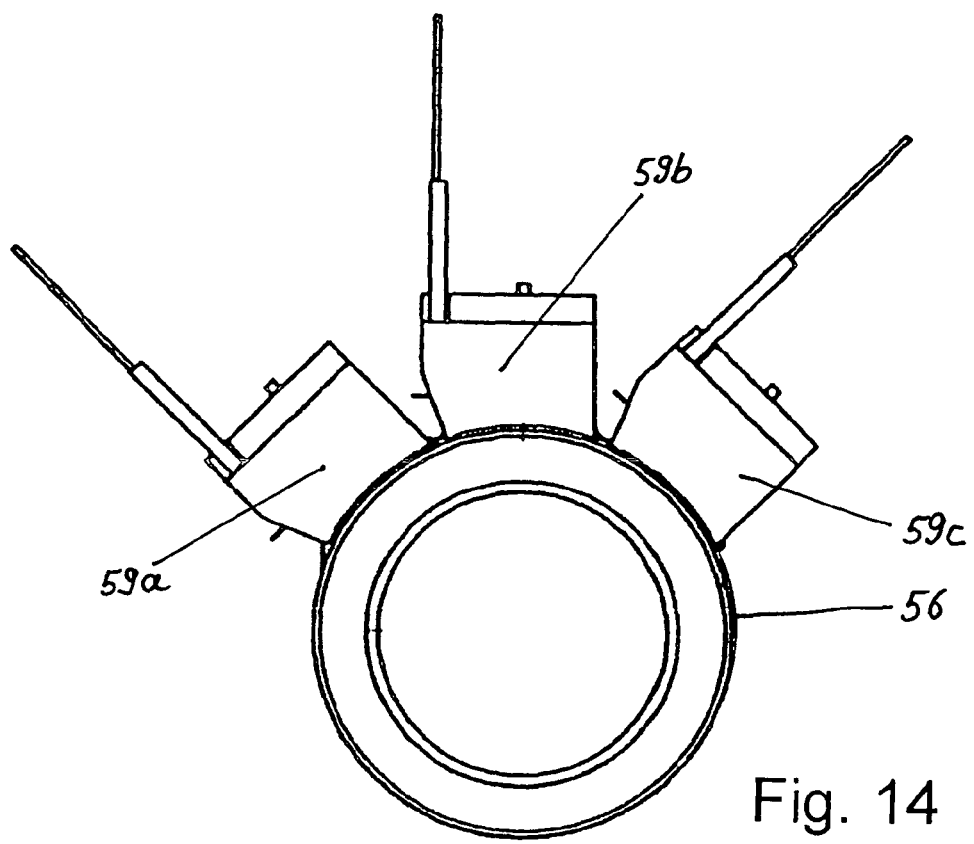
FIG. 14 is an end-face view onto the slip rings and slip brushes of the electrical power transmission means.
Figure 15:
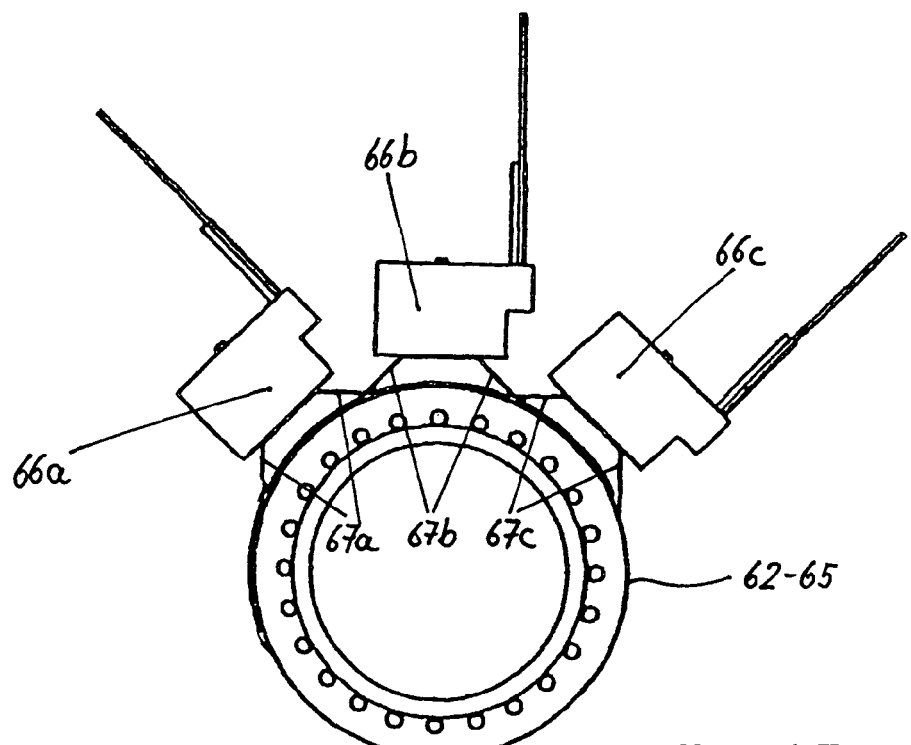
FIG. 15 is an end-face view onto the slip rings and spring contacts of the data transmission means.

Each slip ring 56.1, 56.2, 56.3 is in contact with a number of slip brush blocks 59a, 59b, 59c corresponding to the number of circulating carriages 10 (see also FIG. 14). As in the present case three circulating blocks 10 are present, there are thus three slip brush blocks 59a, 59b, 59c arranged at various points along the circumference of the slip rings 56.1, 56.2, 56.3.

Figure 12:
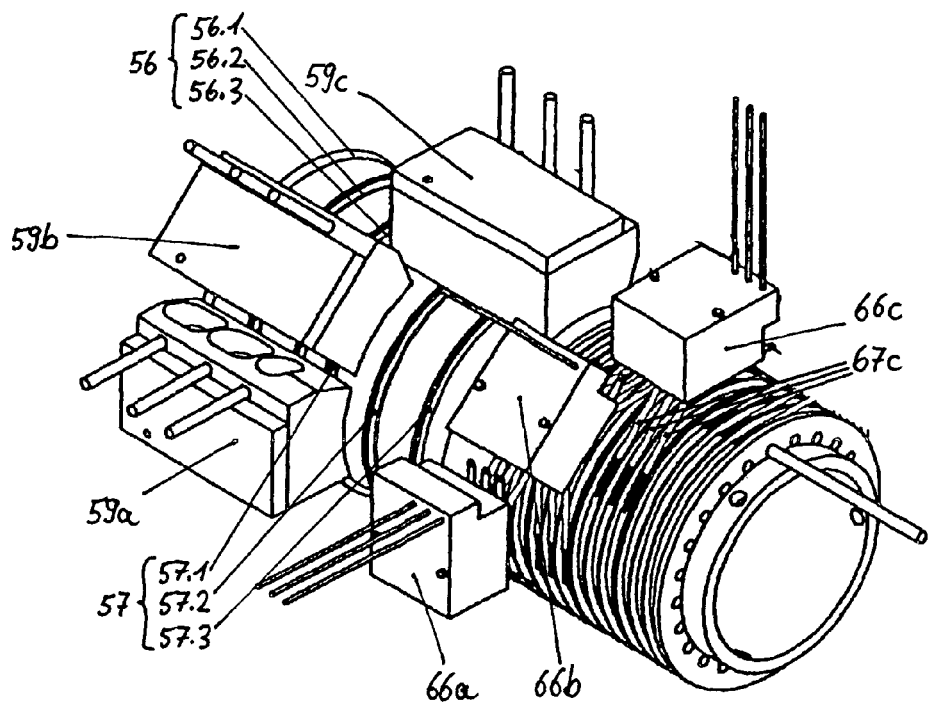
FIG. 12 is a perspective view of the electrical power/data transmission means.

In FIG. 12, in contrast to the exemplary embodiment of FIG. 11, the slip ring block 59c is in contact not with the slip ring group 56, but with the slip ring group 57. If, however, use is made of that voltage which is associated with the slip ring group 56, the slip brush block 59c is also located, in the same way as the slip brush blocks 59a, 59b, on the slip ring group 56. Each slip brush block 59a, 59b, 59c has a three-core slip brush 60a, 60b, 60c which are in contact with the associated slip rings 56.1, 56.2, 56.3 and can slide in a known manner on the outer circumferential surface of the associated slip rings.

The slip brush blocks 59a, 59b, 59c are each fastened to associated retaining bridges 61a, 61b, 61c which are in turn fastened to the associated coupling parts 23a, 23b, 23c of the drive arms 13a, 13b, 13c. If the drive arms 13a, 13b, 13c are made to revolve, the slip brush blocks 59a, 59b, 59c must also move with the associated slip brushes over the circumference of the stationary slip rings 56.1, 56.2, 56.3, ensuring continuous transmission of power from a stationary power generating source to the individual circulating carriages 10.

The data is transmitted to the individual circulating carriages in a similar manner to the transmission of electrical power described hereinbefore. Four slip ring groups 62, 63, 64, 65 are provided for this purpose, as may be seen from FIGS. 11 and 12. Each of these slip ring groups has three slip rings. These slip rings are also arranged, in the same manner as those of the electrical power transmission means, next to one another around the center axis 11, i.e. around the inner drive shaft 22c, and stationarily within the handler. Each slip ring group 62, 63, 64, 65 has three slip rings in order to be able to contact in each case three different cores of a data line integrated in the CAN bus 58.

As may be seen for example from FIGS. 4, 11, 12 and 15, there is fastened to the retaining bridges 61a, 61b, 61c of the individual drive arms 13a, 13b, 13c a respective slip spring block 66a, 66b, 66c, the slip springs 67a, 67b, 67c of which rest on the slip ring groups 62, 63, 64, as shown in FIG. 12. The slip springs 67a, 67b, 67c remain, as the drive arms 13a, 13b, 13c rotate, in sliding contact with the associated slip rings and allow in this way the data to be transmitted from the rotating circulating carriages 10 to a stationary data processing means via the CAN bus 58.

The slip brush blocks 59a, 59b, 59c of the electrical power transmission means and the slip spring blocks 66a, 66b, 66c of the data transmission means are arranged over the circumference of the slip rings in such a way that they do not disturb one another when the associated circulating carriages 10 are moved relative to one another, so that their mutual distances along the circulating path change.

Figure 13:
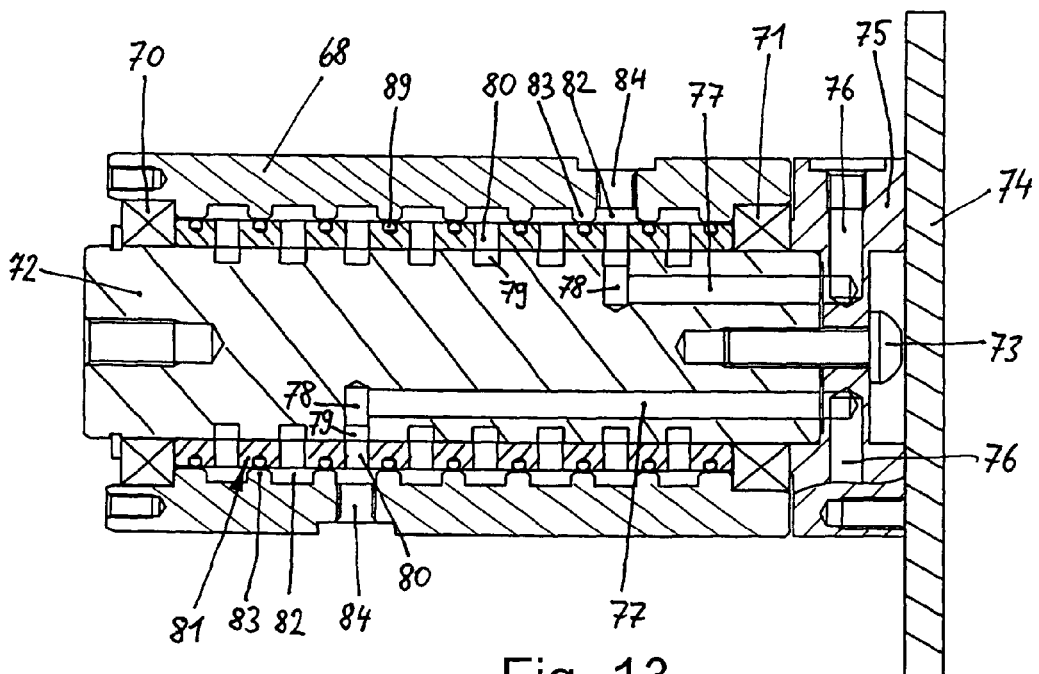
FIG. 13 is a longitudinal section through the vacuum/fluid transfer means in the region of the center axis.

The vacuum/fluid transfer means 54 will be described hereinafter in greater detail with reference to FIGS. 11 and 13.

The vacuum/fluid transfer means 54 has a cylindrical housing 68, the end face of which is securely screwed to the bearing ring 69 and securely connected to the inner drive shaft 22c via said bearing ring. The housing 68 is embodied in a sleeve-like manner and rotatably mounted at the two opposing ends by means of bearings 71 on a stationary, cylindrical central part 72. The central part 72 is fastened by means of a screw 73 to a flange part 74 which can in turn be securely screwed to a stationary support structure of the handler.

The vacuum/fluid transfer means 54 has a total of eight channels in order to supply a total of at most four circulating carriages 10 both with vacuum for securing the components 43 to the press rams 42 by vacuum and with fluid, in particular in the form of purified air, which is used to control the temperature of the components 43 secured by suction. Provided for this purpose in a cylindrical portion 75 of the flange part 74 are a total of eight radial bores 76 which are distributed over the circumference and connected to corresponding lines of a fluid or vacuum supply source of the handler. The radial bores 76 open into eight associated axial bores 77 of different length and the axial bores open in turn into radial bores 78 provided within the central part 72. The radial bores 78 open into associated annular grooves 79 located on the outer circumference of the central part 72. Each of the eight annular grooves 79 is in fluid connection with associated radial bores 80 located in a bush 81 which is arranged in a gap between the central part 72 and the housing 68 and rests securely on the central part 72. The radial bores 80 are formed as throughbores and open into annular chambers 82 which are formed so as to encircle the inner circumferential wall of the housing 68 and are separated from one another by inwardly protruding, peripheral webs 83. Ring seals 89, which interact with the webs 83, ensure fluid-type separation of the individual annular chambers 82. Each annular chamber 82 is connected to a continuous radial conduit 84 in which a corresponding connection piece of a vacuum line 85 (FIG. 11) or fluid supply line 86 can be screwed.

As may be seen from the FIG. 11, the vacuum lines 85 and the fluid supply lines 86, which rotate together with the housing 68 of the vacuum/fluid transfer means 54, and thus together with the inner drive shaft 22c, and are thus stationary relative to the drive shaft 22c, may be passed, close to the drive shaft 22c, through the slip rings and through two retaining rings 87, 88 fastened to the drive shaft 22c and in this way be guided to the individual drive arms 13a, 13b, 13c.

Figure 16:
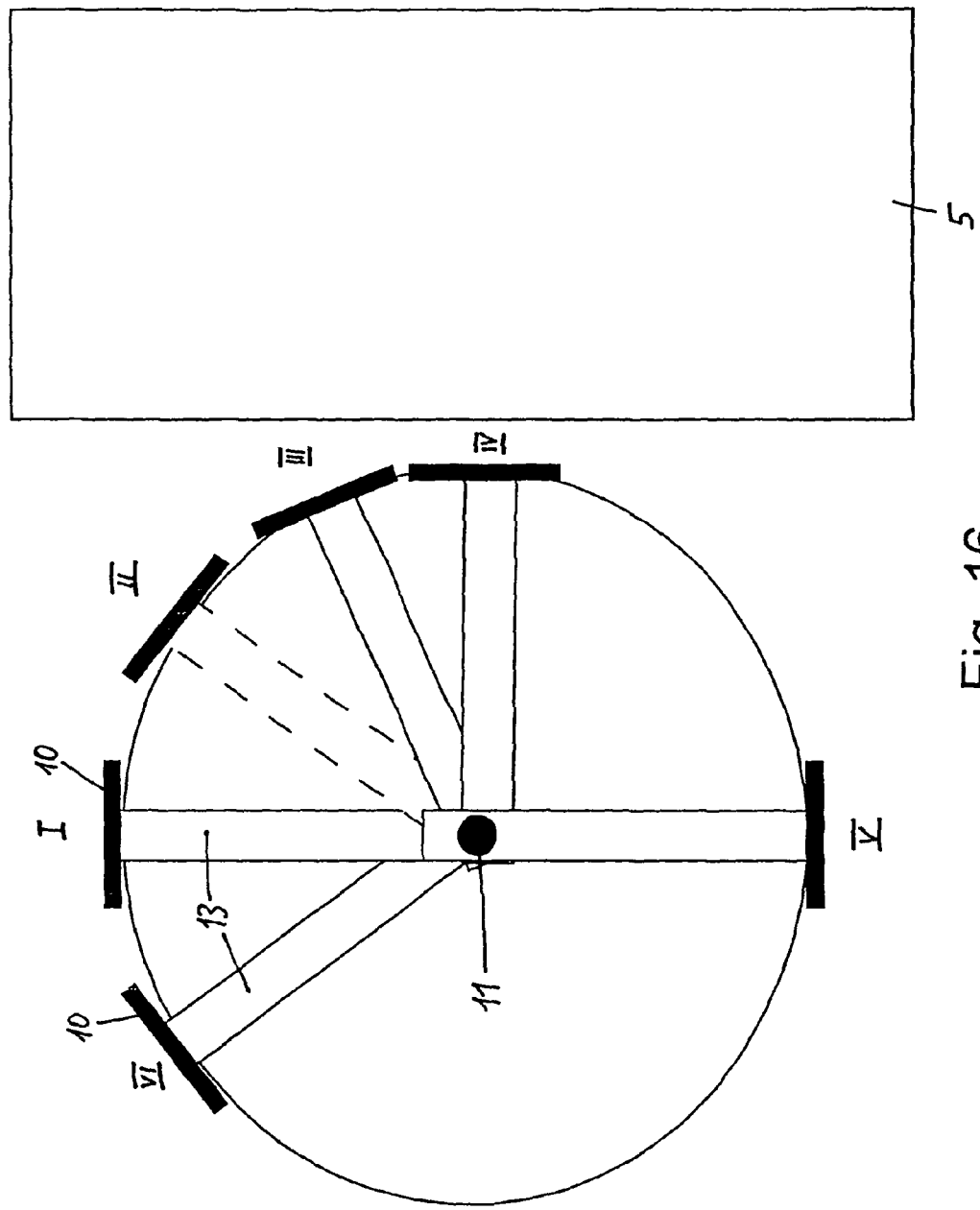
FIG. 16 is a schematic side view of the handler and a test device to illustrate the mode of operation of the handler.

The mode of operation of the handler 4 according to the invention will be described hereinafter by way of example and with reference to FIG. 16. In the position I, which corresponds to the 12 o'clock position and shows the loading station, a circulating carriage 10 is in the loading position in which the components to be tested are transferred from the transport unit 3 (pick and place unit) to the individual retaining units 12. The retaining units 12 have for this purpose press rams 42. The components are attached, in the position I, to the outer ends of the press rams 42 where they can be secured by means of vacuum. The components are positioned in this case parallel to the base plate 15.

When all the retaining units 12 are fitted with a component, the circulating carriage 10 can be further rotated, using the drive means pertaining thereto, through for example 15° in the clockwise direction into a position II (alignment station) in order to carry out there, if required, an alignment of the components.

Once this process has been concluded, the circulating carriage 10 can for example be further rotated through a further 15° into a position III (waiting position) corresponding to a waiting position. In this position III, the circulating carriage 10 waits until another circulating carriage 10 has left a position IV corresponding to a 3 o'clock position.

The position IV (test station) is a position in which the drive arm 13 assumes a horizontal position and the circulating carriage 10 a vertical position. In the position IV, the components are supplied to the test head 5 in the horizontal direction in order to contact the components with the test head 5 and, after completion of the test, removed again from the test head 5 in the horizontal direction. The components are supplied to and removed from the test head 5 in this case by means of the press rams 42, by extending or retracting the press rams 42 relative to the remaining retaining unit 12. In FIG. 2 that press ram 42 which is located on the lateral circulating carriage 10 is shown in the extended position, while the two press rams 42 of the upper circulating carriage 10 are shown in the retracted position. For extending the press rams 42, there is provided in the region between the drive shafts 22 and the circulating carriage 10, which is in the lateral position, a ram advancement means (not shown in the figures) which interacts with the trailing end of the press rams 42. The base plate 15 has for this purpose corresponding openings in the region of the press rams 42. If the press rams 42 are pressed forward, the components mounted to the leading end of the press rams 42 can be brought into contact with corresponding contacts of the test head 5, thus allowing the electrical measurements to be carried out. After completion of the test, the press rams 42 are retracted into their initial retracted position by means of spring force.

After completion of the test, the circulating carriage 10 is further rotated from the position IV into a position V in which the tested components are removed from the handler 4 by means of the removal unit 6 (FIG. 1). In the exemplary embodiment shown, the position V is in the 6 o'clock position.

Once a circulating carriage 10 has left the position IV, a subsequent circulating carriage 10, which is already waiting in direct proximity to the position IV, can be transferred very quickly into the position IV.

After the unloading of the components, a circulating carriage 10 can be transferred further into the position VI which is located in direct proximity to the position and corresponds for example roughly to an 11 o'clock position. The position VI is, again, a waiting position. In this waiting position, the circulating carriage 10 waits until another circulating carriage, which is at that moment in the position I and is in the process of being loaded, has concluded the loading process and left the position I. As soon as the position I has become free, the circulating carriage 10 can be further rotated from the position VI, on the shortest route and as quickly as possible, into the position I in order to be loaded there with new components.

It may be seen that when use is made of a plurality of circulating carriages 10 which can move independently of one another, time-optimized, simultaneous operating can be carried out during loading (position I), testing (position IV) and unloading of the components (position V), as in processes which can be concluded more rapidly than other processes, the remaining time can be used to transfer the circulating carriage 10 in question into a waiting position immediately before the subsequent position. The components are therefore immediately available for the subsequent position when the preceding circulating carriage 10 has left this position. The individual circulating carriages 10 can in this case be further rotated step-by-step into the respectively subsequent position, at all times in the same direction of rotation. There is no need to reverse the direction of rotation.

Very precise positioning of the circulating carriages 10 in the individual position I-VI can be attained in that there are provided on the circulating carriages 10 measuring strips and on the guide means 9 measuring heads which, based on the measuring strips, can ascertain the precise position of the circulating carriages, so that the drive motors 18a, 18b, 18c are caused to move the circulating carriages 10 until they assume the precise desired position.

The invention claimed is:

1. A handler for electronic components such as ICs, comprising
   a plurality of circulating units which can be moved on a circulating path and each have at least one retaining unit for retaining a component and can be moved between a loading station for loading the retaining units with the components,
   a test station for supplying the components to contacting means connected to a test device and an unloading station for removing the components from the retaining units,
   a drive means for moving the circulating units,
   wherein the circulating units each have at least one temperature control chamber containing the components mounted to the retaining units, so that the temperature of the components can be controlled during transportation from the loading station to the test station,
   wherein the circulating units having temperature control chambers can be moved independently of one another on the circular path.

2. The handler as claimed in claim 1, wherein the temperature control chambers are embodied in a trough-shaped manner and each have a housing with a base plate, a front wall, a rear wall and side walls, while the housing (48) is opened radially outwardly and is covered at least in a region between the loading station and the test station by a stationary cover arranged concentrically with the circular path.

3. The handler as claimed in claim 2, wherein the retaining units are fastened to the base plate for retaining the components and comprise press rams which are displaceable relative to the base plate and at the leading end of which a respective component is retained by means of reduced pressure.

4. The handler as claimed in claim 1, wherein there are arranged within the temperature control chambers in each case a plurality of retaining units which are insulated from one another by heat insulating material, so that each retaining unit or a subgroup of retaining units is arranged in an individual chamber surrounded laterally by heating material.

5. The handler as claimed in claim 1, wherein the circulating units consist of circulating carriages which are guided on a stationary, circular guide means.

6. The handler as claimed in claim 5, wherein the neat guide means consists of two circular guides which are arranged set laterally apart from each other in two mutually parallel vertical planes.

7. The handler as claimed in claim 5, wherein the temperature control chambers are mounted in their opposing lateral regions to the circular guide means.

8. The handler as claimed in claim 1, wherein the drive means has, for moving the circulating units, a plurality of drive motors, each circulating unit being operatively connected to its own drive motor.

9. The handler as claimed in claim 5, wherein each circulating carriage is operatively connected to the associated drive motor by means of a separate drive shaft and a drive arm extending from the drive shaft to the associated circulating carriage.

10. The handler as claimed in claim 9, wherein the drive shafts of the individual circulating carriages are arranged one inside another and rotatable about a common center axis.

11. The handler as claimed in claim 10, wherein at least one of the drive shafts serves as a bearing bracket for at least one further drive shaft.

12. The handler as claimed in claim 5, wherein an electrical power transmission means is provided for transmitting electrical current between a stationary current generating source and the circulating carriages, the power transmission means comprising slip rings, which are arranged stationarily next to one another along a center axis, and slip brushes which interact with the slip rings and are fastened to the drive arms.

13. The handler as claimed in claim 12, wherein a plurality of slip brushes are arranged distributed over the circumference of the slip rings.

14. The handler as claimed in claim 5, wherein a data transmission means is provided for transmitting data between stationary data processing equipment and the circulating carriages, the data transmission means comprising a plurality of slip ring groups, which comprise slip rings and are arranged stationarily next to one another along a center axis, and slip springs which interact with the slip rings and are fastened to the drive arms.

15. The handler as claimed in claim 14, wherein the slip rings of the electrical power transmission means and the data transmission means are arranged next to one another in close proximity.

16. The handler as claimed in claim 8, wherein one of the drive shafts is connected to a vacuum/fluid transfer means which is arranged flush therewith and which can be used to transfer vacuum and/or fluid from a stationary vacuum or fluid supply source to the retaining units.

17. The handler as claimed in claim 16, wherein the vacuum/fluid transfer means has a housing, which is rotatably engaged with the drive shaft, and a central part which is arranged within the housing, can be fastened stationarily in the handler and creates, via axial bores and radial bores associated therewith, a vacuum or fluid connection to radial conduits of the housing which can rotate together with the drive shaft.

18. A handler for electronic components such as ICS, comprising
plural circulating units movable on a circulating path and each comprising at least one retaining unit structured to retain a component and to be movable between a loading station for loading the retaining units with the components,
a test station structured to supply the components to a contacting arrangement connected to a test device and an unloading station that removes the components from the retaining units,
a drive device coupled to move the plural circulating units,
wherein the circulating units each have at least one temperature control chamber containing the components mounted to the retaining units, so that the temperature of the components can be controlled during transportation from the loading station to the test station,
wherein the circulating units having temperature control chambers can be moved independently of one another on the circular path.

19. A handler for electronic components such as ICs, comprising
plural circulating units movable on a circulating path and each comprising at least one retaining unit structured to retain a component and to be movable between a loading station for loading the retaining units with the components,
a test station structured to supply the components to a contacting arrangement connected to a test device and an unloading station that removes the components from the retaining units,
a drive device coupled to move the plural circulating units,
wherein the circulating units each have at least one temperature control chamber containing the components mounted to the retaining units, so that the temperature of the components can be controlled during transportation from the loading station to the test station,
wherein the drive device has, for moving the circulating units, a plurality of drive motors, each circulating unit being operatively connected to its own drive motor.

* * * * *